United States Patent
Ohmi et al.

(10) Patent No.: US 8,064,003 B2
(45) Date of Patent: Nov. 22, 2011

(54) THIN FILM TRANSISTOR INTEGRATED CIRCUIT DEVICE, ACTIVE MATRIX DISPLAY DEVICE, AND MANUFACTURING METHODS OF THE SAME

(75) Inventors: Tadahiro Ohmi, Sendai (JP); Akihiro Morimoto, Sendai (JP); Teruhiko Suzuki, Tokyo (JP); Takeyoshi Kato, Tokyo (JP)

(73) Assignees: Tadahiro Ohmi, Sendai-shi (JP); Zeon Corporation, Tokyo (JP)

( * ) Notice: Subject to any disclaimer, the term of this patent is extended or adjusted under 35 U.S.C. 154(b) by 837 days.

(21) Appl. No.: 10/581,035

(22) PCT Filed: Nov. 26, 2004

(86) PCT No.: PCT/JP2004/017557
§ 371 (c)(1), (2), (4) Date: Apr. 20, 2007

(87) PCT Pub. No.: WO2005/057530
PCT Pub. Date: Jun. 23, 2005

(65) Prior Publication Data
US 2007/0222933 A1   Sep. 27, 2007

(30) Foreign Application Priority Data
Nov. 28, 2003   (JP) .................................. 2003-400300

(51) Int. Cl.
*G02F 1/136* (2006.01)

(52) U.S. Cl. ................ 349/42; 349/43; 257/59; 257/72

(58) Field of Classification Search ................ 349/42, 349/43; 257/59, 72
See application file for complete search history.

(56) References Cited

U.S. PATENT DOCUMENTS

| | | |
|---|---|---|
| 6,846,890 B2 * | 1/2005 | Miyaki et al. ................ 526/281 |
| 6,905,903 B2 | 6/2005 | Hasegawa et al. |
| 6,933,180 B2 * | 8/2005 | Tanaka et al. ................ 438/149 |
| 2001/0049064 A1 | 12/2001 | Lee et al. |
| 2002/0012080 A1 * | 1/2002 | Ishihara et al. ................ 349/43 |
| 2002/0171084 A1 | 11/2002 | Yasuda et al. |
| 2003/0095217 A1 * | 5/2003 | Sakamoto et al. ............ 349/106 |
| 2004/0005739 A1 * | 1/2004 | Furusawa .................... 438/149 |
| 2004/0027056 A1 * | 2/2004 | Chino .......................... 313/500 |

FOREIGN PATENT DOCUMENTS

| | | |
|---|---|---|
| JP | 64-18757 U | 1/1989 |
| JP | 1-68727 A | 3/1989 |
| JP | 1-120070 A | 5/1989 |

(Continued)

OTHER PUBLICATIONS

Japanese Office Action dated Aug. 3, 2011 issued in corresponding Japanese Patent Application No. 2005-516083 (English translation of the relevant part).

*Primary Examiner* — Michael Caley
(74) *Attorney, Agent, or Firm* — Birch, Stewart, Kolasch & Birch, LLP (57) ABSTRACT

There is provided an active matrix display device including a flattening layer formed so as to surround a source electrode wiring, a drain electrode wiring, and a signal line, so that the source electrode wiring, the drain electrode wiring, and the signal line form substantially the same surface with the flattening layer.

10 Claims, 7 Drawing Sheets

| | FOREIGN PATENT DOCUMENTS | |
|---|---|---|
| JP | 2-79308 A | 3/1990 |
| JP | 3-116778 A | 5/1991 |
| JP | 4-305627 A | 10/1992 |
| JP | 4-334061 A | 11/1992 |
| JP | 4334061 | 11/1992 |
| JP | 7-230099 A | 8/1995 |
| JP | 10-209463 A | 8/1998 |
| JP | 2850564 B2 | 11/1998 |
| JP | 11-52574 A | 2/1999 |
| JP | 2000-47235 A | 2/2000 |
| JP | 2001188343 A * | 7/2001 |
| JP | 2001-318622 A | 11/2001 |
| JP | 2002-26014 A | 1/2002 |
| JP | 2002-55364 A | 2/2002 |
| JP | 2002-98994 A | 4/2002 |
| JP | 2002-296780 A | 10/2002 |
| JP | 2002-324966 A | 11/2002 |
| JP | 2003-37270 A | 2/2003 |
| WO | WO 03033454 A1 * | 4/2003 |
| WO | WO-2004/110117 A1 | 6/2004 |

* cited by examiner

THIN FILM TRANSISTOR INTEGRATED CIRCUIT DEVICE, ACTIVE MATRIX DISPLAY DEVICE, AND MANUFACTURING METHODS OF THE SAME

TECHNICAL FIELD

This invention relates to a thin film transistor integrated circuit device and further relates to an active matrix display device using thin film transistors (TFTS) and manufacturing methods thereof.

BACKGROUND ART

A thin film transistor integrated circuit device constitutes a microprocessor, a system LSI (large scale integration) circuit, or the like by disposing, on an insulator substrate such as a glass substrate or on a substrate of which at least the surface is an insulator, many thin film transistors and a single wiring layer or multiple wiring layers adapted to connect those transistors to each other and to a power supply and input/output terminals. As one of its embodiments, there is an active matrix display device such as an active matrix liquid crystal display device or an organic EL (electroluminescence) display device. The active matrix display device basically has pixels arranged in a matrix, thin film transistors (hereinafter abbreviated as TFTs) arranged in a matrix so as to correspond to the respective pixels and used as switching elements, and lines in a row direction and lines in a column direction forming a matrix. The lines in the row direction are used as scanning lines adapted to apply scan signals, transmitting signal write timings, to gate electrodes of the TFTs, while, the lines in the column direction are used as signal lines adapted to supply signals corresponding to a display image to the pixels through the TFT switches. Therefore, the signal lines are connected to ones of source electrodes and drain electrodes of the TFTs and the others of the source electrodes and the drain electrodes of the TFTs are connected to pixel electrodes. The TFT switch is turned on by a timing signal applied to the gate electrode from the scanning line, thereby supplying a signal to the pixel. Such active matrix display devices are classified into an active matrix liquid crystal display device, an organic EL display device, and so on according to kinds of pixels. The entire substrate including the scanning lines, the signal lines, and the TFTs is also called an active matrix substrate, which is constituted by forming, on the surface of the substrate, circuit patterns in layers through film formation processes, photolithography processes, and so on in a decompressed atmosphere. In terms of cost reduction of the display device, reduction of the film formation processes and the photolithography processes in the decompressed atmosphere has been discussed.

Particularly, the process of forming the wiring by sputtering is a main cause for increasing the manufacturing cost of the active matrix substrate because, since a wiring material formed over the entire surface is processed by a photolithography method to thereby form wiring portions, most of the material is removed by etching and, further, a material target, which is large as compared with the area of the substrate, is used for ensuring uniformity of the film thickness, and therefore, the material utilization efficiency is extremely low.

For solving such a problem, there has been developed a technique that forms wiring only at necessary portions by a printing method, thereby enhancing the material utilization efficiency. For example, Japanese Unexamined Patent Application Publication (JP-A) No. 2002-026014 (Patent Document 1) discloses a method of forming wiring at predetermined portions by the use of an inkjet method. By the use of such a printing method, the decompression process can be eliminated to reduce the manufacturing cost of the display device.

On the other hand, in active matrix display devices, there have been widely used TFT elements, operating as switching elements, of the inverted stagger type where gate electrodes are formed on the substrate side. The display device using the inverted stagger type TFTs is formed as described in Japanese Unexamined Patent Application Publication (JP-A) No. 2002-98994 (Patent Document 2) or the like. That is, in Patent Document 2, at first, gate electrodes are formed on a glass substrate by a photolithography method and, thereafter, a process of forming a gate insulating film is carried out. Then, an amorphous silicon layer and an n+-type amorphous silicon layer to be a contact layer are stacked as semiconductor layers. Separation between source and drain electrodes and the n+-type amorphous silicon layer forming contacts is carried out by the use of a halftone exposure technique that modulates the exposure amount by the use of a slit mask or the like so as to adjust the thickness of a resist after development and then performs etching. Subsequently, the remaining photoresist is stripped and passivation film formation at channel portions is carried out by a CVD (chemical vapor deposition) method.

Patent Document 1:
Japanese Unexamined Patent Application Publication No. 2002-026014
Patent Document 2:
Japanese Unexamined Patent Application Publication No. 2002-98994
Patent Document 3:
Specification of Japanese Patent Application No. 2003-159315
Patent Document 4:
Japanese Unexamined Patent Application Publication No. 2002-324966

DISCLOSURE OF THE INVENTION

Problem to be Solved by the Invention

In the case of forming the wiring by the use of the printing method such as the inkjet method, when writing a fine pattern like in the display device, wiring ink is received at predetermined positions by forming a water repellent film at portions where formation of the wiring is not necessary, so that the fine pattern can be formed, as described in Patent Document 1. However, Patent Document 1 gives no suggestion at all about application to active matrix TFTs including active regions other than the wiring.

On the other hand, Patent Document 2 discloses applying a photosensitive acrylic-based resin after forming main portions such as the source and drain electrodes, thereby achieving flattening. Further, Patent Document 2 discloses a method of forming source and drain contact portions by the use of the halftone method.

However, Patent Document 2 describes nothing about flattening main portions including source and drain electrode wiring. Further, Patent Document 2 discusses nothing about occurrence of signal loss or delay on signal lines following an increase in size of a display. Therefore, in Patent Document 2, it is expected that there arises a problem that full signals cannot be written into pixels.

For solving this problem, it is considered to increase the width of the wiring or the thickness of the wiring so as to reduce the wiring resistance, thereby reducing the signal loss and delay. However, there is a problem that if the wiring width is increased, the area of a display effective portion occupying the entire display is reduced so that the brightness is lowered. On the other hand, as a method of increasing the wiring thickness, it is considered to cover the signal lines with a flattening layer, thereby preventing occurrence of a level difference at the surface of the flattening layer, as described in Patent Document 1. However, as the display size increases, there is a limit to the increase in thickness of the wiring.

In Patent Document 3, the present inventors have proposed a technique of forming a transparent film on the surface of a substrate and selectively embedding wiring portions in the transparent film, thereby flattening the surface. In this technique, by surrounding the gate wiring, formed on the substrate, with the transparent film, it is possible to eliminate a level difference between the gate wiring and the transparent film. Herein, the transparent film serves as a flattening layer to absorb the level difference caused by the gate wiring.

However, Patent Document 3 only aims at flattening the surface by embedding in the transparent film the gate wiring and gate electrodes directly formed on the surface of the glass substrate and discloses nothing about flattening the surfaces of TFT source and drain portions formed on such a flattened surface. Further, Patent Document 3 mentions nothing about flattening the source and drain electrodes, the source wiring, and the drain wiring.

Further, any of Patent Documents 1 to 3 points out nothing about an issue caused by a level difference generated between the source electrode wiring and drain electrodes and regions other than those.

Means for Solving the Problem

This invention has been made in terms of the foregoing problems and has an object to provide a thin film transistor integrated circuit device having flat wiring.

It is another object of this invention to provide an active matrix display device having flattened electrode wiring.

It is still another object of this invention to provide a thin film transistor manufacturing method that is applicable with a printing method such as an inkjet printing method or a plating method.

According to one aspect of this invention, there is obtained a thin film transistor integrated circuit device having a plurality of thin film transistors formed on an insulating substrate and wiring connected to these thin film transistors, wherein the thin film transistor integrated circuit device comprises a flattening layer surrounding the wiring, and a surface of the wiring and a surface of the flattening layer form substantially the same plane. Herein, it may be configured so that the wiring includes gate wiring, source wiring, and drain wiring, the gate wiring being connected to a gate electrode of at least one of the thin film transistors, the source wiring being connected to a source electrode of at least one of the thin film transistors, the drain wiring being connected to a drain electrode of at least one of the thin film transistors, and wherein the flattening layer surrounds the source electrode, the drain electrode, the source wiring, and the drain wiring, surfaces of the source electrode, the drain electrode, the source wiring, and the drain wiring, and the surface of the flattening layer forming substantially the same plane.

According to another aspect of this invention, there is obtained an active matrix display device having a plurality of thin film transistors disposed in a matrix on an insulating substrate and wiring connected to these thin film transistors, wherein the active matrix display device comprises a flattening layer surrounding the wiring, and a surface of the wiring and a surface of the flattening layer form substantially the same plane. Herein, it may be configured so that the wiring includes gate wiring, source wiring, and drain wiring, the gate wiring constituting scanning lines connected to gate electrodes of the thin film transistors, the source wiring and the drain wiring being respectively connected to source electrodes and drain electrodes of the thin film transistors, one of the source wiring and the drain wiring constituting signal lines adapted to supply signals to the thin film transistors while the other is connected to pixel electrodes, and wherein the flattening layer surrounds the source electrodes, the drain electrodes, the source wiring, and the drain wiring, surfaces of the source electrodes, the drain electrodes, the source wiring, and the drain wiring, and the surface of the flattening layer forming substantially the same plane.

According to still another aspect of this invention, there is obtained a manufacturing method of a thin film transistor integrated circuit device or an active matrix display device comprising a step of forming gate electrodes and a gate wiring on an insulating substrate, a step of forming an insulating film so as to cover the gate electrodes and the gate wiring, a step of selectively forming a semiconductor layer on the insulating film, a step of selectively forming a flattening layer on the semiconductor layer, a step of selectively removing part of the flattening layer to form a groove reaching the semiconductor layer, and a step of forming a wiring portion in the groove such that a surface of the wiring portion and a surface of the flattening layer form substantially the same plane, the wiring portion reaching the semiconductor layer. Herein, the step of forming the wiring portion may include a step of forming a wiring formation assisting layer and a step of filling the groove with a wiring material. The wiring formation assisting layer may be one of a liftoff layer, a catalyst layer, and a water repellent layer, but the water repellent layer is preferable. By forming the water repellent layer at a portion where formation of the wiring is not necessary, the wiring material is accurately received at a predetermined position, so that an excellent fine pattern can be formed. With respect also to the liftoff layer, by forming the liftoff layer at a portion where formation of the wiring is not necessary, applying the wiring material over the entire surface, and then removing the liftoff layer by dissolution or stripping by the use of a chemical solution, it is possible to leave the wiring material only at a predetermined position. The flattening layer may serve as the wiring formation assisting layer. The step of selectively forming the semiconductor layer preferably includes a step of forming a layer of a first semiconductor, a step of stacking, on the layer of the first semiconductor, a layer of a second semiconductor having a conductivity different from that of the first semiconductor, a step of stacking a photoresist on a stacked film of the first semiconductor and the second semiconductor, a step of removing by an entire thickness a portion, other than on a predetermined element region, of the photoresist and by part of a thickness a portion, on a channel region in the element region, of the photoresist, a step of, using the remainder of the photoresist as a mask, selectively removing a portion, other than the element region, of the stacked film of the first and second semiconductors and the layer of the second semiconductor on the channel region, and a step of selectively forming a protective film on the layer of the first semiconductor in the channel region. The step of removing the photoresist preferably includes a step of exposing the photoresist by adjusting an exposure amount so that a remaining thickness of the photoresist on the channel region becomes thinner as compared with a remaining thickness of the photoresist on the other portion of the element region and a step of developing the exposed photoresist to remove the photoresist on a portion other than the element region, thereby obtaining a patterned photoresist. In the step of forming the protective film, a portion of the patterned photoresist remaining through the semiconductor selectively removing step preferably is used as a mask. The protective film can be formed by a direct nitriding method.

In a conventionally proposed active matrix display device, a level difference is inevitably generated between the surfaces of signal lines, source electrodes, and drain electrodes, and the surface of a region surrounding them. For reducing the wiring resistance without lowering the brightness of the display device, it is desirable to increase the thickness of the wiring (thick film wiring). However, as the thickness of the wiring increases, the level difference also increases. In this invention, the flattening layer is provided in the region surrounding the signal lines, the source electrodes, and the drain electrodes so as to absorb the level difference between the surfaces of the signal lines, the source electrodes, and the drain electrodes, and the surface of the region surrounding them. Even by providing the flattening layer, there still remains some residual level difference between the signal lines, the source electrodes, and the drain electrodes, and the flattening layer. According to the study of the present inventors, it has been found that a smaller residual level difference causes a smaller influence such as disconnection of upper-layer wiring, orientation disorder of liquid crystals, lifetime degradation of organic EL elements, or the like, which is thus preferable. Specifically, approximately 1 µm or less is preferable and 0.5 µm or less is more preferable.

Therefore, in this invention, substantially the same plane represents that the level difference between the surface of each of the signal line, the source wiring, the drain wiring, the source electrodes, and the drain electrodes, and the surface of the flattening layer is 1 µm or less and preferably 0.5 µm or less.

The flattening layer is preferably formed of a resin and this resin is preferably selected from the group consisting of an acrylic resin, a silicone resin, a fluororesin, a polyimide resin, a polyolefin resin, an alicyclic olefin resin, and an epoxy resin. The alicyclic olefin resin represents a resin having an alicyclic structure. The flattening layer may be formed of a photosensitive resin composition or may be formed by the use of a resin composition containing an alkali-soluble alicyclic olefin resin and a radiation sensitive component. Further, the flattening layer may contain an inorganic substance.

Further, in this invention, the wiring such as the signal lines, the source electrodes, and the drain electrodes each may contain an organic substance.

The foregoing insulating substrate of this invention may be formed of a glass or plastic material.

Further, the device of this invention may be any of a liquid crystal display device, an organic EL display device, a CPU, and a microprocessor.

In the manufacturing method of this invention, the step of filling the groove with the wiring material is preferably carried out by one of a sputtering method, a CVD method, a plating method, and a printing method. The printing method is preferably an inkjet printing method or a screen printing method in terms of filling position accuracy.

According to the device of this invention, since the surfaces of the wiring, the source electrodes, and the drain electrodes form substantially the same plane with the flattening layer surrounding them, the flat wiring structure can be achieved without stacking the flattening layer on the signal lines and thus the thick film wiring can be easily achieved. Further, in the case where the flattening layer is formed of a resin, it can be formed without requiring a decompression process such as CVD and, therefore, the manufacturing cost of the device can be reduced.

Further, according to the manufacturing method of this invention, since use can be made of the printing method such as the inkjet printing method or the screen printing method, or the plating method for forming the wiring, the source electrodes, and the drain electrodes, the display device can be manufactured at low cost and with high yield.

Further, according to the active matrix display device of this invention, since the structure is flat with no level different shape otherwise caused by the scanning lines and the gate wiring, it is possible to obtain an excellent display with less degradation of the display elements.

According to this invention, in the active matrix display device having, on the insulating substrate, at least, the scanning lines, the signal lines, and the thin film transistors provided near crossing portions between the scanning lines and the signal lines and each having the gate electrode connected to the scanning line and the source or drain electrode connected to the signal line, since the surfaces of the signal lines, the source electrodes, and the drain electrodes form substantially the same plane with the flattening layer surrounding them, the flat wiring structure can be achieved without stacking the flattening layer on the signal lines and thus the thick film wiring can be easily achieved. Further, in the case where the flattening layer is formed of a resin, it can be formed without requiring a decompression process such as CVD and, therefore, the manufacturing cost of the active matrix display device can be reduced.

On the other hand, according to the manufacturing method of the active matrix display device of this invention, since use can be made of the printing method such as the inkjet printing method or the screen printing method, or the plating method for forming the signal lines, the source electrodes, and the drain electrodes, the display device can be manufactured at low cost and with high yield.

Since the active matrix display device of this invention has the flat structure with no level different shape otherwise caused by the scanning lines and the gate wiring, it is possible to obtain an excellent display with less degradation of the display elements and, further, the pixel electrodes can be overlapped with the source and drain electrode wiring so that there is also an effect that the pixel electrodes can be enlarged.

BRIEF DESCRIPTION OF THE DRAWINGS

FIGS. 6(a) and (b) are sectional views for explaining part of manufacturing processes of the active matrix liquid crystal display device shown in FIG. 5.

BEST MODE FOR CARRYING OUT THE INVENTION

Hereinbelow, embodiments will be described with reference to the drawings.

Embodiment 1

Figure 1:
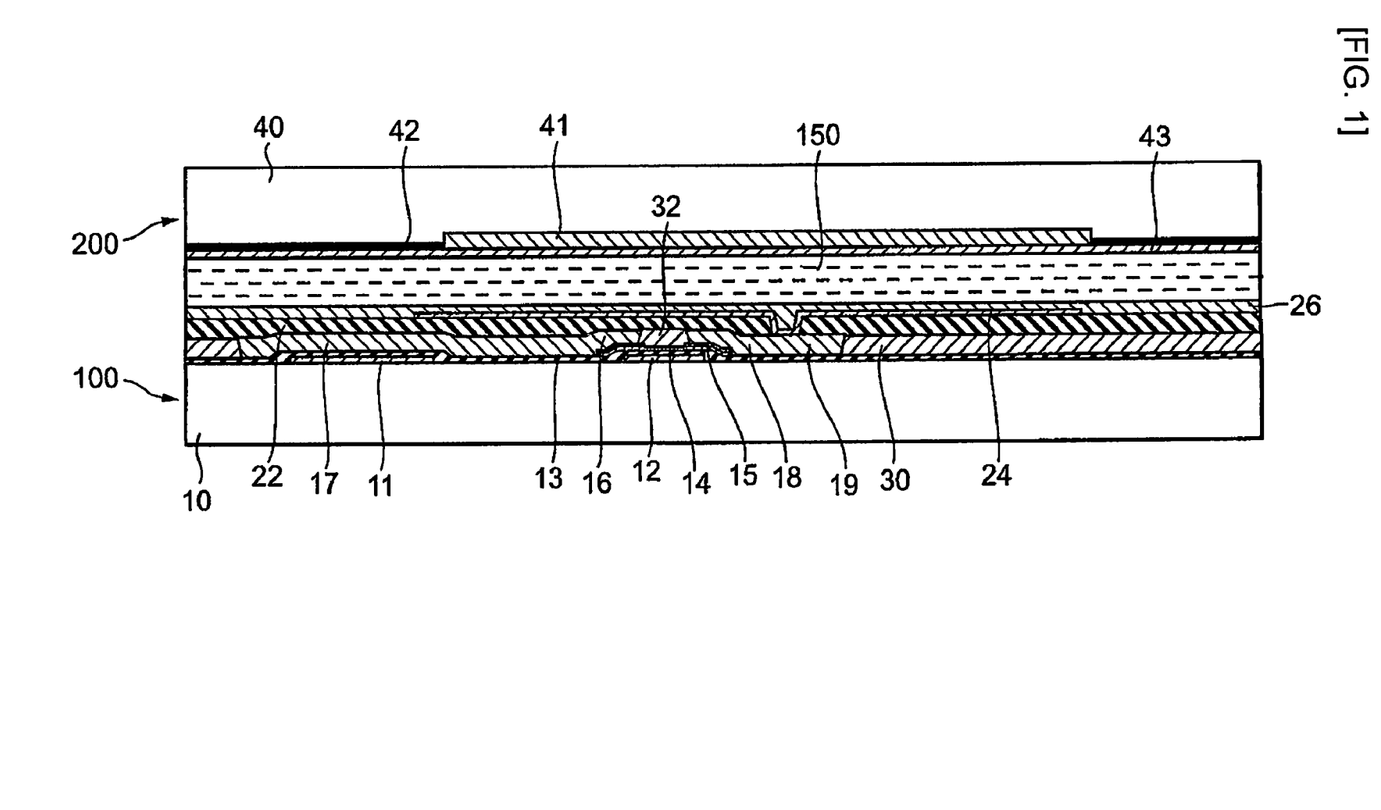
FIG. 1 is a sectional view for explaining an active matrix liquid crystal display device according to Embodiment 1 of this invention.

Referring to FIG. 1, description will be made about an active matrix liquid crystal display device according to Embodiment 1 of this invention. FIG. 1 is a schematic diagram showing a section of the active matrix liquid crystal display device according to this Embodiment 1, wherein the illustrated liquid crystal display device comprises an active matrix substrate (hereinafter referred to as a matrix substrate) 100 and a filter substrate 200 disposed so as to face the matrix substrate 100 through liquid crystals 150. Of them, the matrix substrate 100 comprises a glass substrate 10, a scanning line 11 provided on the glass substrate 10, and a gate electrode 12 connected to the scanning line 11 at a non-illustrated portion. Further, a gate insulating film 13 is formed on the scanning line 11 and the gate electrode 12, and a first semiconductor layer 14 and a second semiconductor layer 15 are formed in a thin film transistor (TFT) forming region of the gate insulating film 13. Among them, the second semiconductor layer 15 is formed of a semiconductor having a conductivity different from that of the first semiconductor layer 14 and defines a source region and a drain region provided so as to be spaced apart from each other with a separation region interposed therebetween.

A source electrode 16 is formed on the source region and connected to a signal line 17. On the other hand, a drain electrode 18 is formed on the drain region. The drain electrode 18 is connected to a drain wiring 19. Herein, the gate electrode 12 is provided near a crossing portion between the scanning line 11 provided on the glass substrate 10 and the signal line 17 and, by connecting the source electrode 16 (or the drain electrode 18) to the signal line 17, a TFT is formed.

Further, an interlayer insulating film 22 is formed so as to cover the signal line 17, the source electrode 16, the drain electrode 18, and the drain wiring 19, a pixel electrode 24 electrically connected to the drain wiring 19 is formed on the interlayer insulating film 22, and an orientation film 26 is formed on the pixel electrode 24 and the interlayer insulating film 22, thereby constituting the active matrix substrate 100.

On the other hand, the filter substrate 200 is composed of an opposing glass substrate 40, a color filter 41, a black matrix 42, and an orientation film 43. Since the configuration of the filter substrate 200 is the same as that normally used, explanation thereof is omitted herein.

The liquid crystal display device according to Embodiment 1 of this invention shown in FIG. 1 is characterized by a flattening layer 30 provided so as to surround the signal line 17, the source electrode 16, the drain wiring 19, and the drain electrode 18. In the illustrated example, a flattening layer 32 is also formed on the separation region (or a channel region) separating the source region and the drain region from each other. These flattening layers 30 and 32 form substantially the same plane with the signal line 17, the source electrode 16, the drain wiring 19, and the drain electrode 18.

In the illustrated example, on the plane obtained by forming the flattening layers 30 and 32, the pixel electrode 24 is disposed through the interlayer insulating film 22. By filling with a wiring precursor grooves formed by the flattening layers 30 and 32, it is possible to form wiring at predetermined positions and, therefore, the flattening layers 30 and 32 can also be called wiring formation assisting layers.

Herein, the flattening layers 30 and 32 may contain an inorganic substance, but are preferably formed of a resin. As the resin forming the flattening layers 30 and 32, use can be made of a resin selected from the group consisting of an acrylic resin, a silicone resin, a fluororesin, a polyimide resin, a polyolefin resin, an alicyclic olefin resin, and an epoxy resin. Further, the resin forming the flattening layers 30 and 32 may be a photosensitive resin composition and, in this case, it is preferable to use a resin composition containing an alkali-soluble alicyclic olefin resin and a radiation sensitive component. Further, as the resin forming the flattening layers 30 and 32, use can be made of a transparent or opaque resin. The signal line 17, the source electrode 16, the drain electrode 18, and the drain wiring 19 may each contain an organic substance.

Figure 2:
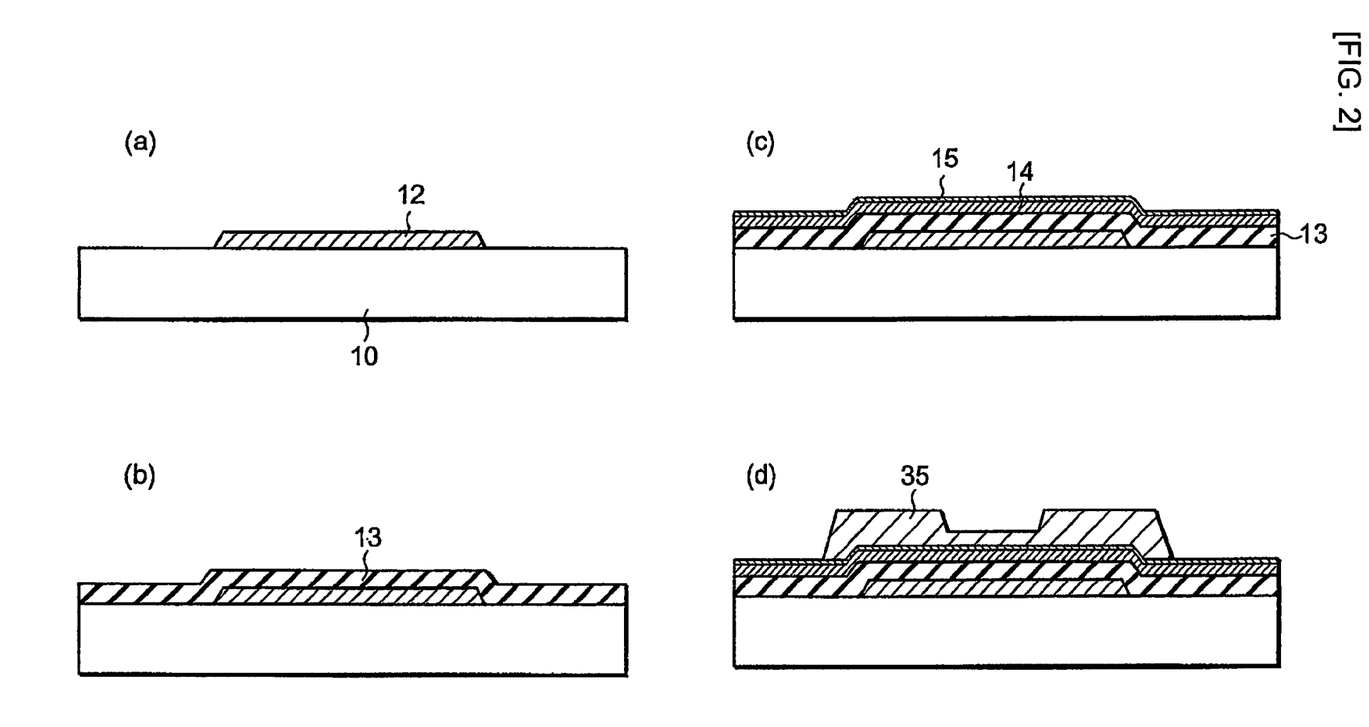
FIG. 2 is sectional views for explaining, in order of process, a manufacturing method (part 1) of the active matrix liquid crystal display device shown in FIG. 1.
Figure 3:
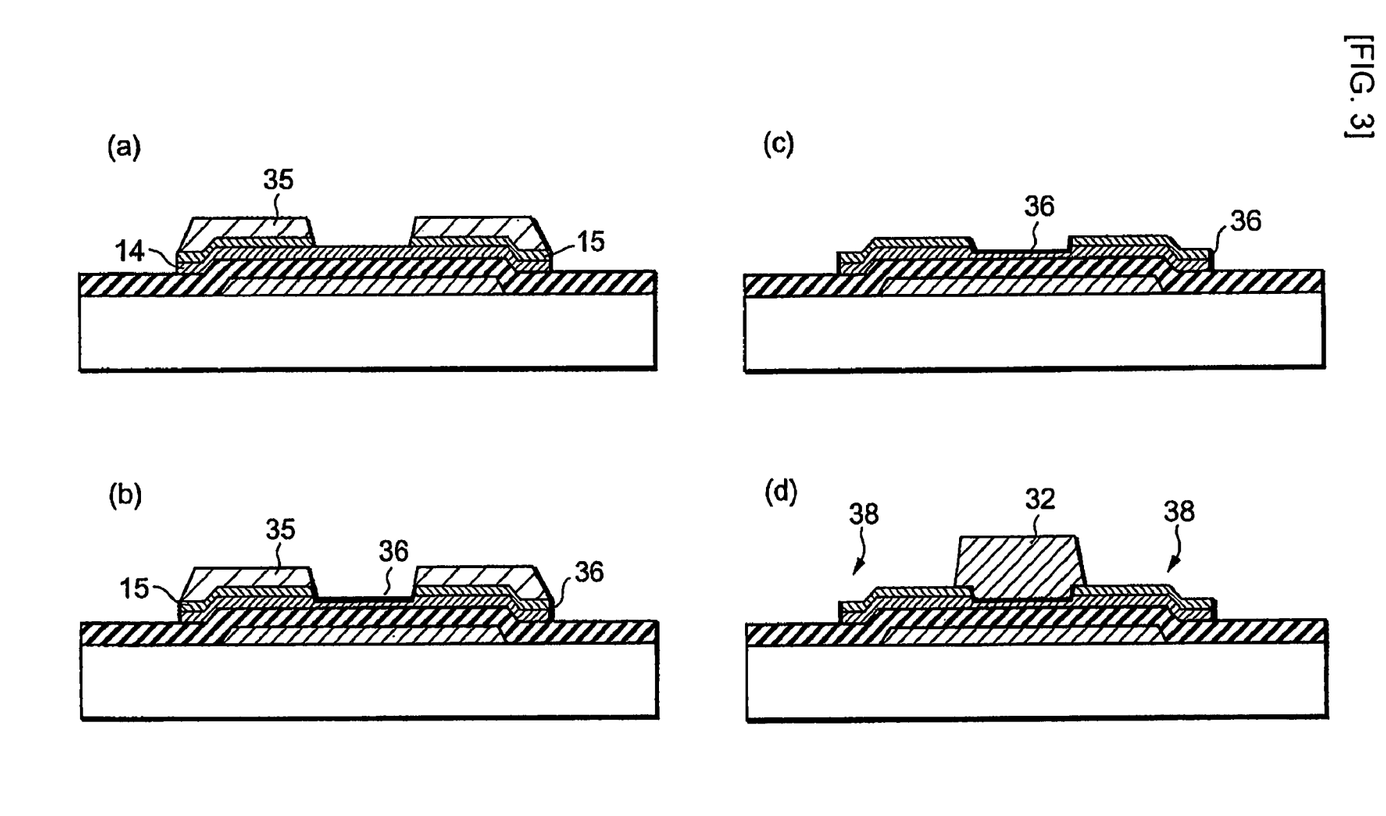
FIG. 3(a) to (d) are sectional views for explaining, in order of process, a manufacturing method (part 2) of the active matrix liquid crystal display device shown in FIG. 1.
Figure 4:
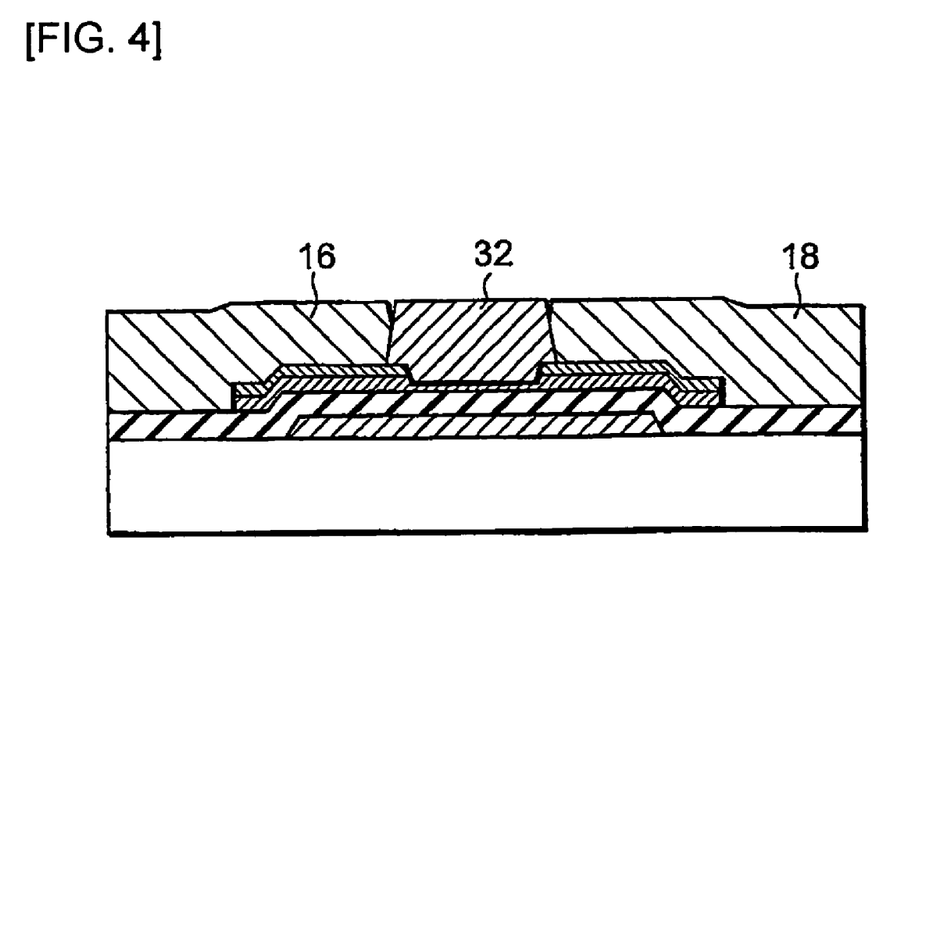
FIG. 4 is a sectional view for explaining, in order of process, a manufacturing method (part 3) of the active matrix liquid crystal display device shown in FIG. 1.

Referring to FIGS. 2 to 4, description will be made about a manufacturing method of the active matrix liquid crystal display device according to Embodiment 1 of this invention. At first, as shown in FIG. 2(a), a scanning line and a gate electrode 12 are continuously formed on a glass substrate 10 by a photolithography method (herein, only the gate electrode 12 connected to the scanning line is illustrated). The thickness of the gate electrode 12 (thus, the wiring thickness of the scanning line) was set to 0.2 μm.

Then, as shown in FIG. 2(b), a silicon nitride film ($SiN_x$ film) was formed as a gate insulating film 13 by the use of a $SiH_4$ gas, a $H_2$ gas, a $N_2$ gas, and an Ar gas according to a plasma CVD method using a microwave excited plasma. Although a $SiN_x$ film can also be formed by the use of a normal high-frequency excited plasma, the formation of the $SiN_x$ film can be achieved at a lower temperature by the use of the microwave excited plasma. The film formation temperature was set to 300° C. and the film thickness to 0.2 μm.

Further, an amorphous silicon layer as a first semiconductor layer 14 and an n+-type amorphous silicon layer as a second semiconductor layer 15 were formed in order each by a plasma CVD method using a microwave excited plasma. The amorphous silicon layer 14 was formed by the use of a $SiH_4$ gas and the n+-type amorphous silicon layer 15 was formed by the use of a $SiH_4$ gas, a $PH_3$ gas, and an Ar gas, each at a temperature of 300° C. (FIG. 2(c)).

Subsequently, a positive photoresist was applied over the entire surface by a spin coating method and then dried on a hot plate at 100° C. for one minute, thereby removing a solvent. Then, using a g-line stepper, exposure was carried out in a dose amount of 36 mJ/cm$^2$ energy. In the exposure, the exposure amount was adjusted by the use of a slit mask so that an unexposed portion was formed to leave the photoresist on an element region and the thickness of the photoresist on a portion corresponding to a channel region located in the element region was reduced. As a result of carrying out puddle development for 70 seconds using a 2.38% TMAH solution, there was obtained a photoresist film 35 having a shape as shown in FIG. 2(d). That is, as shown in FIG. 2(d), there was formed the photoresist film 35 that increased in thickness on the element region while decreased in thickness on the channel region.

Then, using a plasma etching apparatus, etching was applied to the n+-type amorphous silicon layer 15 and the amorphous silicon layer 14. In this event, since the photoresist film 35 is also etched to some extent to reduce its thickness, the thin resist film portion, on the channel region, of the photoresist film 35 is removed by etching and the n+-type amorphous silicon layer 15 is also etched. However, the amorphous silicon layer 14 remains in the channel region.

On the other hand, other than at the element region portion, the n+-type amorphous silicon layer 15 and the amorphous silicon layer 14 were both entirely removed by etching and, when the etching process was finished at the time of the removal by etching of the n+-type amorphous silicon layer 15 in the channel region, there was obtained a structure as shown in FIG. 3(a). In this state, as clear from FIG. 3(a), the photoresist film 35 still remains on regions of the n+-type amorphous silicon layer 15 on which a source electrode 16 and a drain electrode 18 are to be formed, respectively.

Then, in this state, using an Ar gas, a $N_2$ gas, and a $H_2$ gas, a microwave excited plasma treatment is carried out to directly form a nitride film 36 on the surface of the amorphous silicon layer 14 at the channel portion (FIG. 3(b)). It is also possible to form a nitride film 36 by the use of a general high-frequency plasma, but it is desirable to use the microwave excited plasma. This is because since it is possible to produce a plasma whose electron temperature is low, the nitride film 36 can be formed without damaging the channel portion due to the plasma. It is also possible to form a nitride film 36 by a CVD method but, when the CVD method is used, the nitride film is also formed over the source and drain electrode regions and, therefore, a process is required for removing the nitride film over the source and drain electrode regions later. Therefore, as illustrated, it is more preferable to directly form the nitride film 36 by carrying out the microwave excited plasma treatment using the Ar gas, the $N_2$ gas, and the $H_2$ gas. In this event, as illustrated, the nitride film 36 is also directly formed on side surfaces of the amorphous silicon layers 14 and 15 at an end portion of the element region.

Then, the photoresist film 35 remaining on the source electrode region and the drain electrode region (FIG. 3(b)) is applied with oxygen plasma ashing and then removed by the use of a resist stripping solution or the like, thereby obtaining a shape like FIG. 3(c).

Subsequently, a photosensitive transparent resin film precursor (photosensitive resin composition) is applied and, using a photomask for forming the signal line 17, the source electrode 16, the drain electrode 18, and the drain wiring 19 shown in FIG. 1, exposure, development, and post-baking are carried out, so that, as shown in FIG. 3(d), a wiring formation assisting layer 32 made of the transparent resin is formed so as to cover the channel region and end portions, on the channel region side, of the source and drain electrode regions. In this event, as shown in FIG. 1, a wiring formation assisting layer 30 is also formed in regions that should surround the signal line 17, the source electrode 16, the drain electrode 18, and the drain wiring 19. By the formation of the wiring formation assisting layers 30 and 32, as shown in FIG. 3(d), grooves 38 are defined, surrounded by the wiring formation assisting layers 30 and 32, in regions where the signal line 17, the source electrode 16, the drain electrode 18, and the drain wiring 19 are to be formed. As clear from the foregoing, in the illustrated example, the transparent photosensitive resin composition is used as the wiring formation assisting layers 30 and 32.

In these grooves 38, the signal line 17, the source electrode 16, the drain electrode 18, and the drain wiring 19 can be formed by a printing method such as an inkjet printing method or a plating method.

When the wiring width is very small, a treatment may be carried out to provide water repellency to the surfaces of the transparent resin layers (wiring formation assisting layers) 30 and 32 for the purpose of enhancing the accuracy. Specifically, examples can be cited such as applying a fluorine treatment to the surfaces by the use of a plasma using a fluorine-based gas such as $NF_3$ or impregnating a fluorine-based silylating agent into the resin precursor before post-baking the resin. Then, the grooves 38 are filled with a wiring precursor by the printing method such as the inkjet printing method or the plating method. The wiring forming method is preferably the inkjet method in terms of efficient use of ink, but use may be made of a screen printing method or the like. In this embodiment, the wiring was formed by the use of silver paste ink like that disclosed in Patent Document 4 (Unexamined Patent Publication No. 2002-324966) as the wiring precursor. In this case, baking was carried out at a temperature of 250° C. for 30 minutes after filling with the wiring precursor, thereby forming the signal line 17, the source electrode 16, the drain electrode 18, and the drain wiring 19 (FIG. 4 and FIG. 1).

In this manner, there was formed a TFT in which the surfaces of the signal line 17, the source electrode 16, the drain electrode 18, and the drain wiring 19 formed substantially the same plane with the surfaces of the wiring formation assisting layers 30 and 32.

Then, an interlayer insulating film 22 (see FIG. 1) was formed on the signal line 17, the source electrode 16, the drain electrode 18, the drain wiring 19, and the wiring formation assisting layers 30 and 32 forming substantially the same plane. As this interlayer insulating film 22, use can be made of a photosensitive transparent resin like the wiring formation assisting layers 30 and 32. When the photosensitive transparent resin is formed into a film as the interlayer insulating film 22 as described above, it is possible to form a contact hole from a pixel electrode 24 to the TFT electrode (herein, the drain wiring 19) by applying exposure and development to the photosensitive transparent resin. Subsequently, an ITO (indium tin oxide) was sputter-deposited on the entire exposed surface and then patterned so as to be the pixel electrode 24. A transparent conductive film material such as $SnO_2$ may be used instead of the ITO. By forming a polyimide film on the surface thereof as a liquid crystal orientation film 26 and holding liquid crystals 150 between the orientation film 26 and an opposing filter substrate 200, an active matrix liquid crystal display device was obtained.

According to the active matrix liquid crystal display device of this Embodiment 1, since the signal line 17, the source electrode 16, the drain electrode 18, and the drain wiring 19 formed substantially the same plane with the flattening layers 30 and 32, it was possible to obtain a high-quality display with less orientation disorder of the liquid crystals.

Embodiment 2

Figure 5:
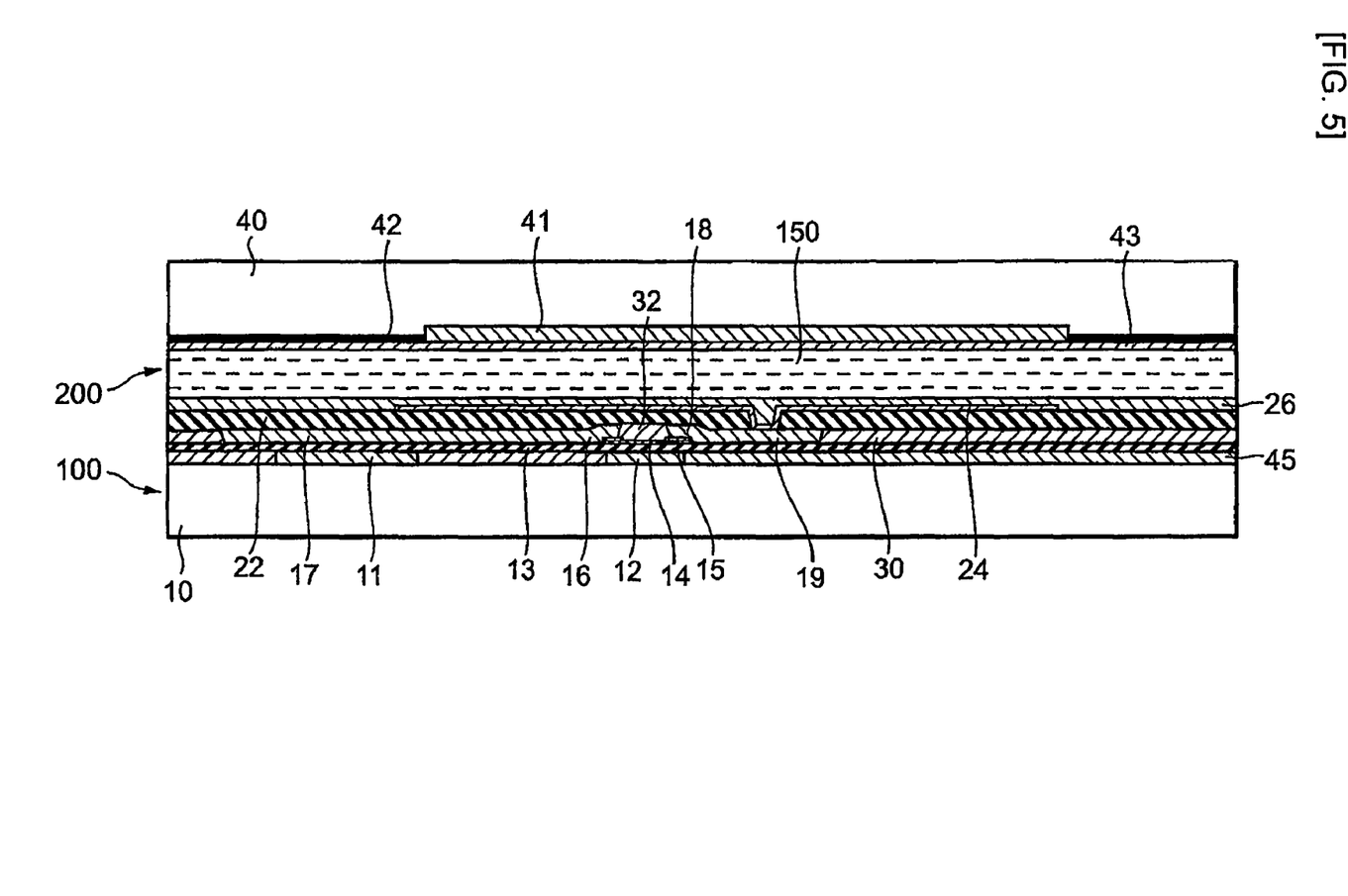
FIG. 5 is a sectional view for explaining an active matrix liquid crystal display device according to Embodiment 2 of this invention.

Referring to FIG. 5, description will be made about an active matrix liquid crystal display device according to Embodiment 2 of this invention. In FIG. 5, the same reference numerals are assigned to portions corresponding to those of the liquid crystal display device shown in FIG. 1. The active matrix liquid crystal display device shown in FIG. 5 differs from the liquid crystal display device shown in FIG. 1 in that a scanning line 11 and a gate electrode 12 formed on a glass substrate 10 are embedded in an insulating film 45 and, as a result, the scanning line 11, the gate electrode 12, and the insulating film 45 also form substantially the same plane and a gate insulating film 13 is uniformly formed on this flattened surface.

Also in FIG. 5, the gate electrode 12 is connected (not shown) to the scanning line 11 near a crossing portion between the scanning line 11 and a signal line 17 and a source or drain electrode 16 or 18 is connected to the signal line 17 on the gate insulating film 13, thereby forming wiring connection to a thin film transistor (TFT).

Further, like in FIG. 1, flattening layers 30 and 32 are formed so as to surround the signal line 17, the source electrode 16, the drain electrode 18, and a drain wiring 19, and the signal line 17, the source electrode 16, the drain electrode 18, and the drain wiring 19 form substantially the same plane with the flattening layers 30 and 32. A pixel electrode 24 is disposed on this plane through an interlayer insulating film 22 to thereby constitute an active matrix substrate and liquid crystals 150 are held between the active matrix substrate and a filter substrate 200, thereby constituting a liquid crystal display device. Also in FIG. 5, the flattening layer 32 is formed in a separation region separating a source region and a drain region from each other. However, since a level difference in this separation region is 0.1 to 0.2 μm, i.e. lower than a level difference at other portions, the flattening layer 32 may not necessarily be provided.

Figure 6:
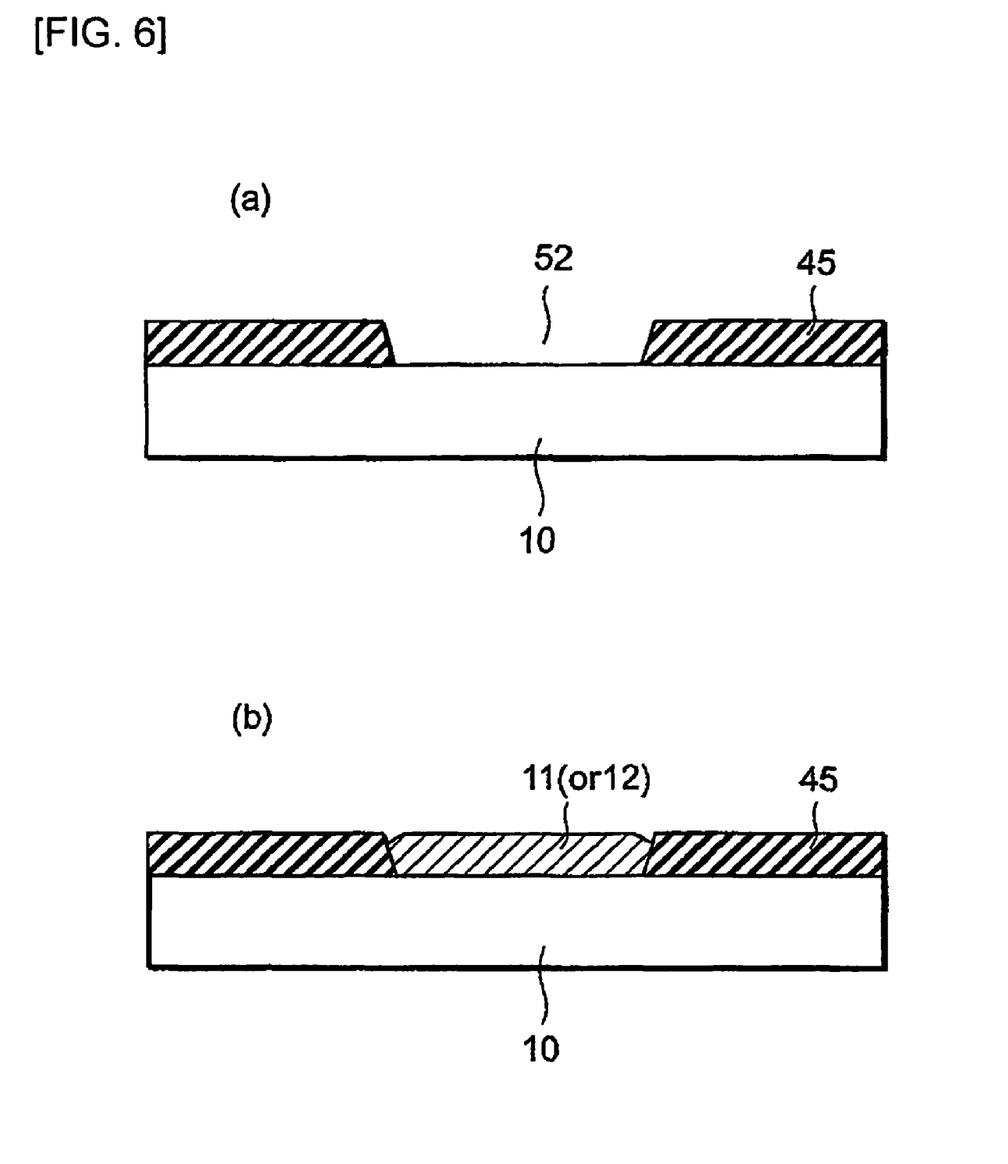

In this Embodiment 2, the scanning line 11 and the gate electrode 12 are in the form of the embedded wiring. This wiring can be formed by the inkjet method. Herein, referring to FIG. 6, description will be made about a method of forming the gate electrode 12 (and wiring such as the scanning line continuous therewith). At first, a photosensitive transparent resin film having photosensitivity and a thickness of 1 μm is formed on the surface of the glass substrate 10 as the foregoing insulating film 45 by a technique such as a spin coating method. When the photosensitive transparent resin film is used as the insulating film 45, it is possible to use this photosensitive transparent resin film as a photoresist film. Then, by selectively exposing, developing and removing, and post-baking the photosensitive transparent resin film (i.e. the insulating film 45) by the use of active radiation, a groove 52 is formed in the photosensitive transparent resin film as shown in FIG. 6(a). When the wiring width is very small, a treatment may be carried out to provide water repellency to the surface of the photosensitive transparent resin film for the purpose of enhancing the printing accuracy. Specifically, examples can be cited such as applying a fluorine treatment to the surface by the use of a plasma of a fluorine-based gas such as $NF_3$ or impregnating a fluorine-based silylating agent into the resin precursor before post-baking the resin.

Then, the foregoing groove is filled with a wiring precursor by the printing method such as the inkjet printing method or the plating method. The wiring forming method is preferably the inkjet method in terms of efficient use of ink, but use may be made of the screen printing method or the like. In this embodiment, the wiring was formed by the use of silver paste ink like that disclosed in Patent Document 2 as the wiring precursor. Baking was carried out at a temperature of 250° C. for 30 minutes after filling with the wiring precursor, thereby forming the scanning line and the gate electrode (FIG. 6(b)).

Thereafter, according to the same method as that described in Embodiment 1, an active matrix liquid crystal display device was completed.

Since this Embodiment 2 had the flattened structure with no level difference otherwise caused by the scanning line 11 and the gate electrode 12, it was possible to obtain an excellent display with less orientation disorder of the liquid crystals 150. Further, since the gate electrode 12 formed substantially the same plane with the insulating layer 45 (the photosensitive transparent resin film in FIG. 6), no level difference was caused at the gate insulating film 13, so that it was possible to form the excellent TFT with less degradation in manufacturing yield and with less insulation failure.

Embodiment 3

Figure 7:
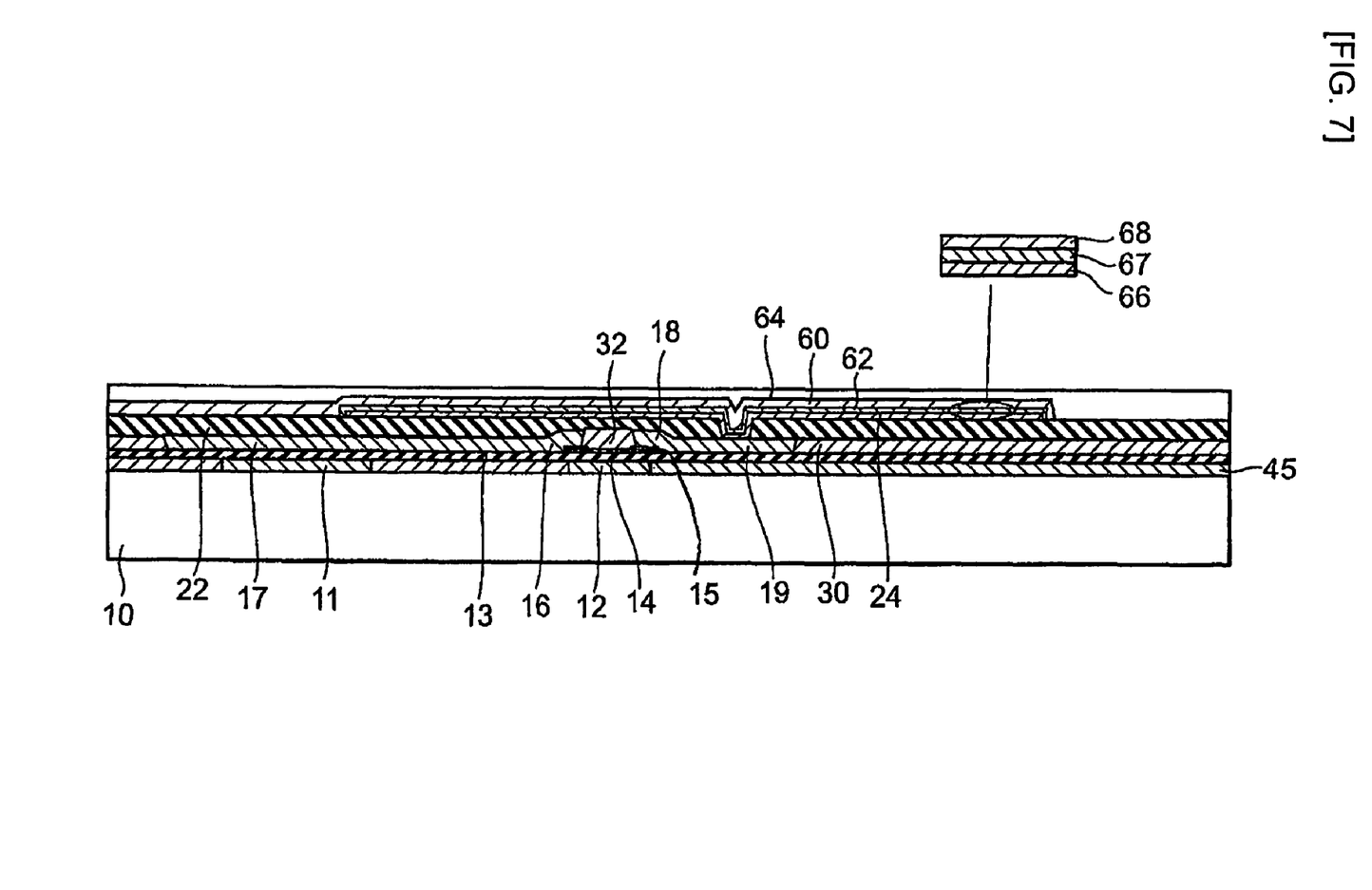
FIG. 7 is a sectional view for explaining an active matrix organic EL display device according to Embodiment 3 of this invention.

In Embodiment 3 of this invention, an active matrix organic EL display device was formed according to a technique like that used in Embodiments 1 and 2. FIG. 7 is a sectional view showing a structure of the formed organic EL display device, wherein, for the sake of explanation, the same reference numerals are assigned to those portions having equivalent functions in FIGS. 1 and 5. The organic EL display device shown in FIG. 7 has a scanning line 11 and a gate electrode 12 formed on a glass substrate 10 and, like in FIG. 5, the illustrated scanning line 11 and gate electrode 12 are embedded in an insulating film 45. As described with reference to FIG. 6, a transparent photosensitive resin can be used as the insulating film 45.

Further, in the illustrated example, a gate insulating film 13 is formed on the scanning line 11, the gate electrode 12, and the insulating film 45, which forms the flat surface, and first and second semiconductor layers 14 and 15, source and drain electrodes 16 and 18, a drain wiring 19, and a signal line 17 are formed on the gate insulating film 13.

The illustrated organic EL display device includes a thin film transistor having the source electrode 16 (which may be the drain electrode 18 and, in this case, the source electrode is connected to a pixel electrode through a source wiring) connected to the signal line 17. Also in the illustrated example, flattening layers 30 and 32 are formed so as to surround the signal line 17, the source electrode 16, the drain electrode 18, and the drain wiring 19, and these signal line 17, source electrode 16, drain electrode 18, and drain wiring 19, and the flattening layers 30 and 32 form substantially the same plane. A pixel electrode 24 made of an ITO is disposed on this plane through an interlayer insulating film 22 and an organic EL layer 62 is held between the pixel electrode 24 and an opposing electrode 60, thereby constituting an active matrix organic EL display device. In the illustrated example, the opposing electrode 60 is covered with a protective film 64.

Since it is the same as Embodiments 1 and 2 up to the formation of the pixel electrode 24, description will be mainly made herein about a method of forming the organic EL layer 62. To schematically explain a forming method of the pixel electrode 24, since the scanning line 11, the gate electrode wiring 12, and the insulating film 45, which constitutes substantially the same plane and, further, the signal line 17 and the source and drain electrode wirings 16 and 18 also formed substantially the same plane with the flattening layers 30 and 32, it was possible to obtain the flat substrate with no level difference in the plane of the pixel electrode 24.

The organic EL layer 62 includes a hole-transporting layer 66, a light-emitting layer 67, and an electron-transporting layer 68. The structure thereof is not particularly limited and use of any of known materials can achieve the function and effect of this invention. Herein, the hole-transporting layer 66 serves to efficiently move holes to the light-emitting layer 67 while prevent electrons from the opposing electrode 60 from passing through the light-emitting layer 67 and moving to the transparent conductive electrode side, thereby increasing the efficiency of recombination of electrons and holes in the light-emitting layer 67. As a material forming the hole-transporting layer 66, although not particularly limited, use can be made of, for example, 1,1-bis(4-di-p-aminophenyl)cyclohexane, carbazole or its derivative, triphenylamine or its derivative, or the like. As the light-emitting layer 67, although not particularly limited, use can be made of a quinolinol aluminum complex containing a dopant, DPVi biphenyl, or the like. Red, green, and blue light emitters may be stacked in layers depending on a use and, in a display device or the like, red, green, and blue light emitters may be used by arranging them in a matrix. As the electron-transporting layer 68, use can be made of a silole derivative, a cyclopentadiene derivative, or the like.

In this Embodiment 3, the hole-transporting layer 66, the light-emitting layer 67, and the electron-transporting layer 68 were stacked in order on the ITO pixel electrode 24 by a deposition method. Then, a film of Al was formed by a deposition method, thereby obtaining the opposing electrode 60. Then, a SiN$_x$ film was deposited by a plasma CVD method, thereby obtaining the protective film 64.

The material of the pixel electrode 24, the material of the opposing electrode 60, and the material of the protective film 64 are not limited to the foregoing, but may be any of materials that fully achieve the performance of the organic EL display device in consideration of the work function and so on. In this manner, the active matrix organic EL display device of this Embodiment 3 is completed. In this configuration, the structure was flat wherein the scanning line 11 and the gate electrode 12 had no level difference and the organic EL layer 62 had no level difference otherwise caused by level differences of the signal line 17, the source electrode 16, the drain electrode 18, and the drain wiring 19, and therefore, it was possible to obtain the display device capable of relaxing electric field local concentration and so on at the organic EL layer and thus having a long light-emitting lifetime. Further, since the gate electrode 12 formed substantially the same plane with the insulating film 45 made of the transparent resin, the gate insulating film 13 was subjected to no level difference, so that it was possible to form the excellent TFT with less degradation in manufacturing yield and with less insulation failure. In this Embodiment 3, the bottom emission type organic EL display device was configured. However, it is possible to obtain the same effect with the top emission type and, further, the same effect can be obtained even by arbitrarily changing the configuration order of the organic EL layer 62. In this embodiment, the deposition method was used as the forming method of the organic EL layer 62. However, the effect of this invention can be achieved even by forming it according to the printing method such as the inkjet method so as to match the properties of materials.

INDUSTRIAL APPLICABILITY

This invention is applicable to an active matrix liquid crystal display device, an active matrix organic EL display device, and so on each including TFTs and, particularly, can constitute a display device that is required to be increased in size. Further, this invention is, not being limited to the active matrix display devices, also applicable to general thin film transistor integrated circuit devices each using thin film transistors to form a CPU, a microprocessor, a system LSI, or the like.

The invention claimed is:

1. An active matrix display device including a plurality of thin film transistors disposed in a matrix on a flat surface of an insulating substrate and wiring formed on the flat surface and connected to the thin film transistors:

wherein:

said active matrix display device comprises a flattening layer formed on the flat surface and surrounding said wiring, a surface of said wiring and a surface of said flattening layer form substantially the same plane, which represents that a level difference between the surface of said wiring and the surface of said flattening layer is 1 μm or less, said active matrix display device further comprises an interlayer insulating film on the plane formed by the surface of said wiring and the surface of said flattening layer, and a pixel electrode on said interlayer insulating film, and said flattening layer is formed of a photosensitive resin composition.

2. The active matrix display device according to claim 1, wherein said wiring includes gate wiring, source wiring, and drain wiring, said gate wiring constituting scanning lines connected to gate electrodes of said thin film transistors, said source wiring and said drain wiring being respectively connected to source electrodes and drain electrodes of said thin film transistors, one of said source wiring and said drain wiring constituting signal lines adapted to supply signals to said thin film transistors while the other is connected to pixel electrodes, and wherein said flattening layer surrounds said source electrodes, said drain electrodes, said source wiring, and said drain wiring, surfaces of said source electrodes, said drain electrodes, said source wiring, and said drain wiring, and the surface of said flattening layer forming substantially the same plane, which represents that a level difference between the surface of each of said source electrodes, said drain electrodes, said source wiring, and said drain wiring and the surface of said flattening layer is 1 μm or less.

3. The active matrix display device according to claim 1, wherein said flattening layer comprises an inorganic substance.

4. The active matrix display device according to claim 1, wherein said flattening layer is formed by the use of a resin composition comprising, an alkali-soluble alicylic olefin resin and a radiation sensitive component.

5. The active matrix display device according to claim 1, wherein said source electrodes, said drain electrodes, said source wiring, and said drain wiring each contain an organic substance.

6. The active matrix display device according to claim 1, wherein said insulating substrate is formed of a transparent material.

7. The active matrix display device according to claim 1, wherein said insulating substrate is a substrate having a surface covered with an insulator.

8. The active matrix display device according to claim 1, wherein said display device is a liquid crystal display device.

9. The active matrix display device according to claim 1, wherein said display device is an organic EL display device.

10. The active matrix display device according to claim 1, wherein said flattening layer is transparent.

* * * * *